(12) United States Patent
Tsuchiya et al.

(10) Patent No.: US 7,521,929 B2
(45) Date of Patent: Apr. 21, 2009

(54) NMR SYSTEM AND PROBE POSITIONING METHOD

(75) Inventors: Mitsuyoshi Tsuchiya, Hitachi (JP); Michiya Okada, Mito (JP); Fumio Iida, Hitachi (JP); Hiromitsu Seino, Iwaki (JP)

(73) Assignee: Hitachi, Ltd., Tokyo (JP)

( * ) Notice: Subject to any disclaimer, the term of this patent is extended or adjusted under 35 U.S.C. 154(b) by 92 days.

(21) Appl. No.: 11/621,611

(22) Filed: Jan. 10, 2007

(65) Prior Publication Data
US 2007/0164745 A1    Jul. 19, 2007

(30) Foreign Application Priority Data
Jan. 13, 2006   (JP) .............................. 2006-005651

(51) Int. Cl.
*G01V 3/00*   (2006.01)
(52) U.S. Cl. ........................................ 324/309; 324/307
(58) Field of Classification Search ................ 324/309, 324/307, 306
See application file for complete search history.

(56) References Cited
U.S. PATENT DOCUMENTS
5,882,304 A * 3/1999 Ehnholm et al. ............ 600/411
6,687,530 B2 * 2/2004 Dumoulin ................... 600/423
7,141,977 B2 * 11/2006 Wakuda et al. .............. 324/319

FOREIGN PATENT DOCUMENTS
JP    2002-311118    10/2002

* cited by examiner

*Primary Examiner*—Louis M Arana
(74) *Attorney, Agent, or Firm*—Antonelli, Terry, Stout & Kraus, LLP.

(57) ABSTRACT

In an NMR apparatus provided with a split type magnet, in order to position a probe at a high precision in a narrow homogeneous magnetic field space, a positioning of a center of a probe coil is first located to a proper position by inserting an NMR probe from a horizontal bore. At this position, a sample tube is inserted from a vertical bore, and an NMR signal is measured from the probe coil. An NMR signal measuring apparatus amplifies the NMR signal from the probe coil, and executes an A/D conversion so as to determine an NMR spectrum signal, and an NMR signal analyzing apparatus compares the NMR spectrum signal. A probe is set at a position where a sharpness of the spectrum is largest, that is, a magnetic field homogeneity coefficient is high, by repeating the operations mentioned above.

8 Claims, 6 Drawing Sheets

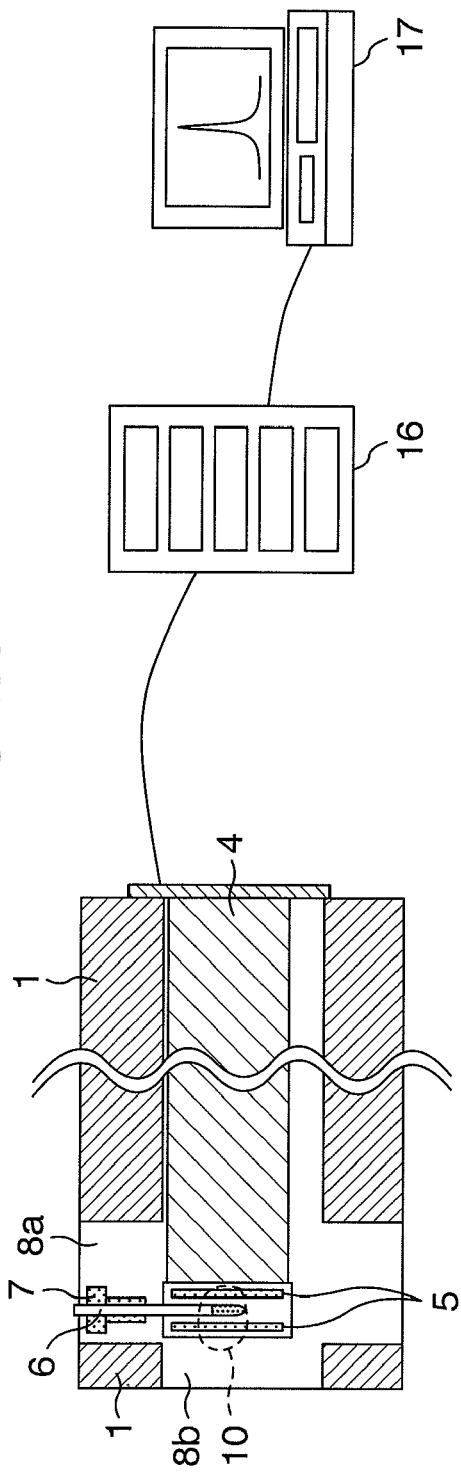
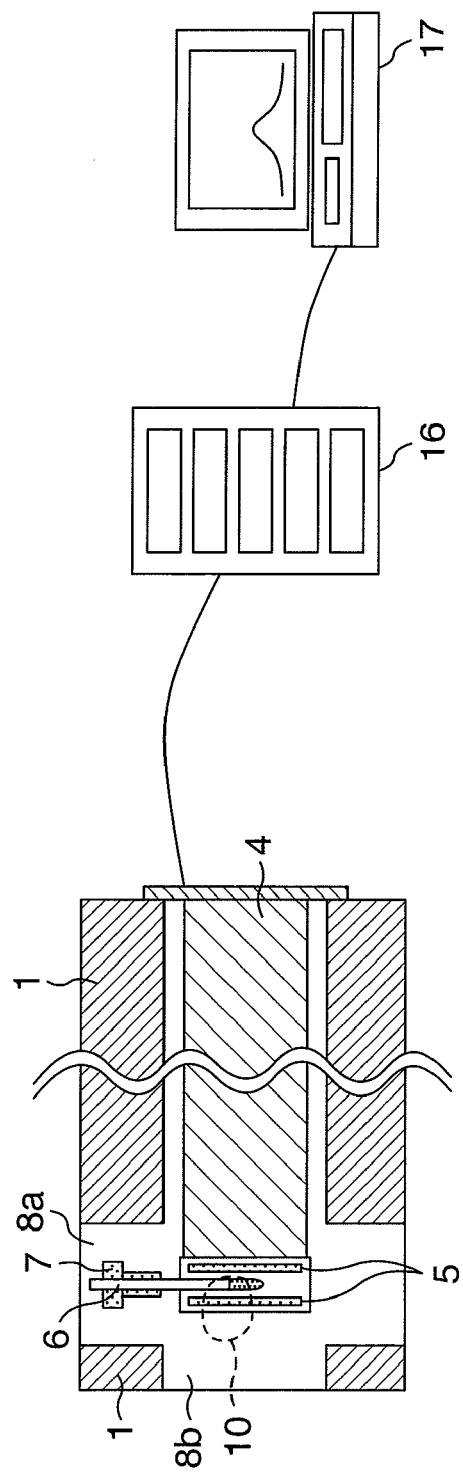

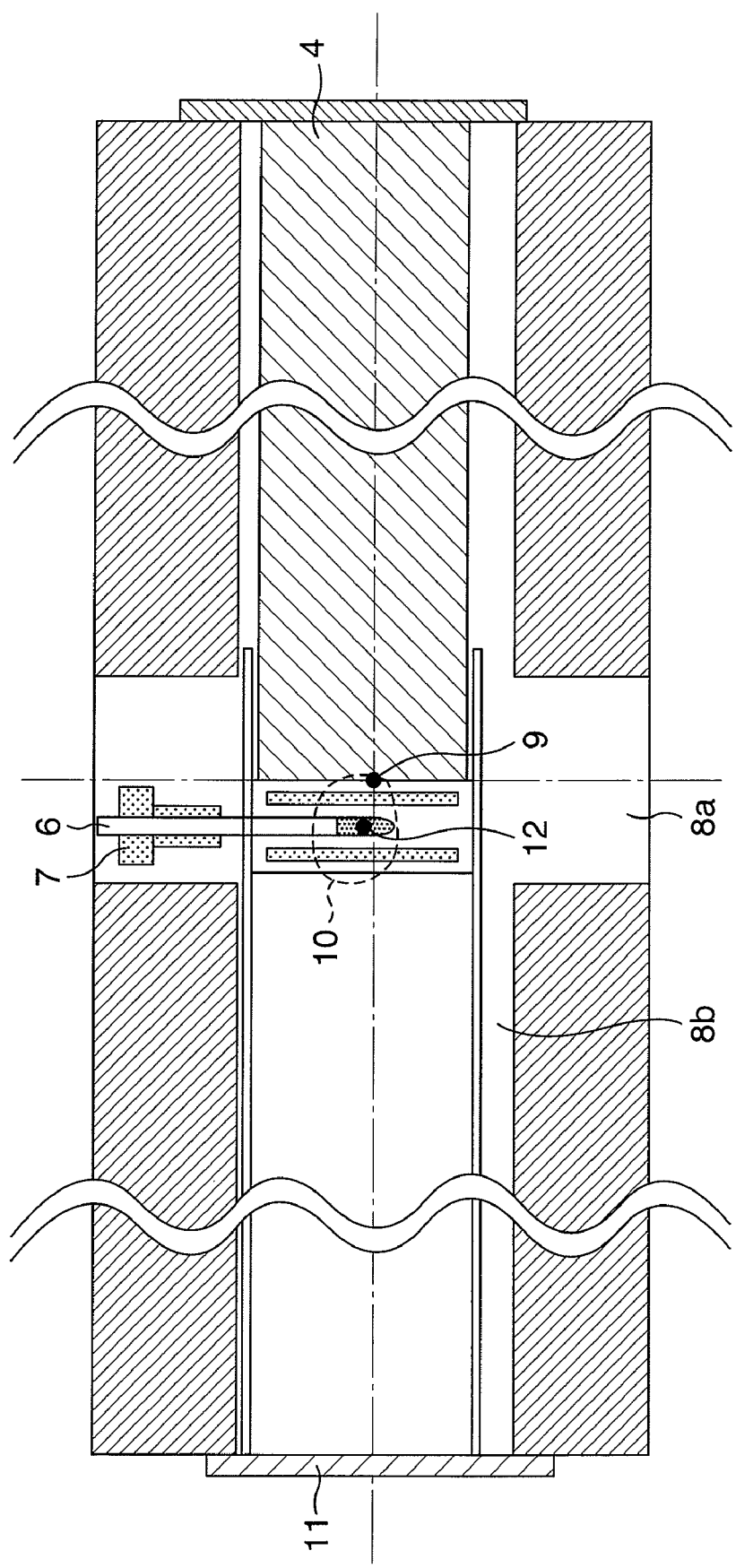

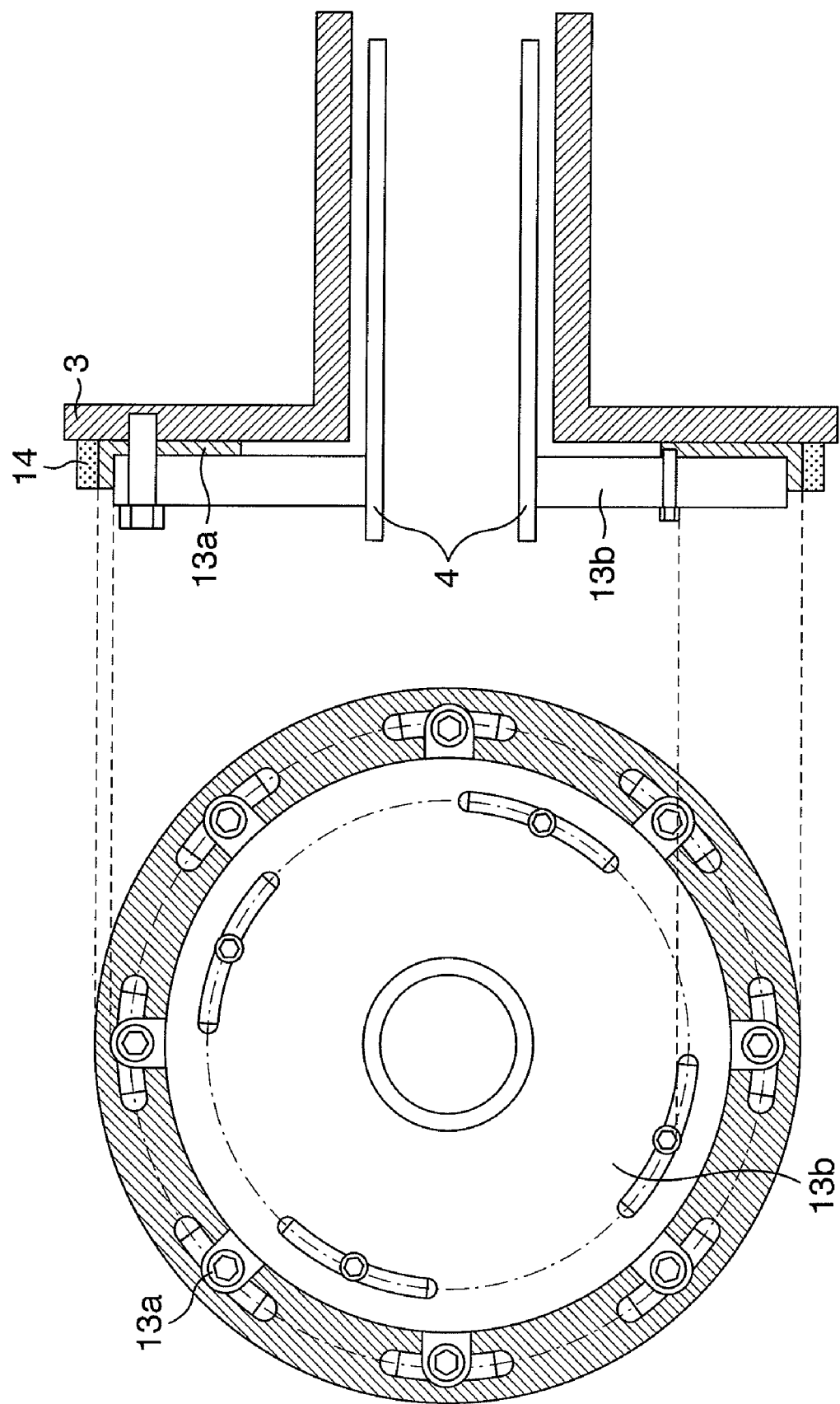

NMR SYSTEM AND PROBE POSITIONING METHOD

FIELD OF THE INVENTION

The present invention relates to a nuclear magnetic resonance apparatus (hereinafter, refer to as NMR apparatus) having a split type magnet and a multi-axial bore, and more particularly to a positioning method of an NMR probe.

DESCRIPTION OF RELATED ART

The NMR apparatus corresponds to an apparatus structured such as to place a measured sample in a homogeneous magnetic field space, and measure a nuclear magnetic resonance phenomenon generated by irradiating a radio wave by a coil surrounding the sample, and is applied to wide fields such as a solid state physics, a chemistry, a biology and the like. In recent years, a high sensitivity is intended such that a structure analysis can be achieved by an NMR signal even in the case that the sample to be measured is constituted by a protein having a complicated molecular structure.

As a method of achieving the high sensitivity, there have been known a method of strengthening a magnetic field intensity of the homogeneous magnetic field space in which the measured sample is placed, and a method of changing a shape of a probe coil. The former uses a superconducting wire rod for a magnet generating a magnetic field so as to improve characteristics thereof, thereby achieving a high sensitivity, and the latter changes a conventional saddle type or a cage type to a solenoid type, thereby increasing a detecting efficiency of the NMR signal on the basis of a shape effect.

In order to measure the NMR signal by using the solenoid type probe coil, it is necessary that an axial direction of the probe coil is perpendicular to a direction of the homogeneous magnetic field space. Considering an insertion of a sample tube into the probe coil, it is hard to conduct the measure by means of the conventional NMR apparatus using the solenoid type magnet because a direction of the homogeneous magnetic field is coaxial with a sample tube inserting direction.

Accordingly, there has been considered an NMR apparatus using a split type magnet having a superconducting magnet structure. The split type magnet can be provided with a space (a bore) to which the probe or the like is inserted in a plurality of axial directions. A probe coil is inserted from a horizontal bore provided in a center shaft of a split magnet, a sample tube is inserted from a vertical bore provided in a split gap portion in a vertical direction, and these elements are located in a homogeneous magnetic field space around a center of the bore. Accordingly, the sample tube can be provided in the solenoid type coil, whereby it is possible to measure the NMR signal.

Further, in order to measure the NMR signal at a high sensitivity, it is necessary to precisely locate the probe coil and the sample tube in the homogeneous magnetic field space. This is similar in an NMR apparatus provided with a solenoid type magnet without being limited to the split type magnet, and there is proposed in JP-A-2002-311118 a method of accurately positioning it in an axial direction by a shape of a spinner attached to the sample tube and a jig for the apparatus.

Even in the NMR apparatus provided with the split type magnet, it is necessary to precisely locate the probe coil and the sample tube in the narrow homogeneous magnetic field space. In general, as shown in FIG. 3, an intersecting point of an axis of a horizontal bore 8b to which an NMR probe 4 is inserted and an axis of a vertical bore 8a to which the sample tube 6 is inserted is defined as a bore center 9, and an NMR measurement is executed at the bore center 9. Accordingly, the probe is designed in such a manner that the bore center 9 and a center of the probe coil coincide with each other, and the coincided center and a center 12 of a sample measuring region are designed in such a manner as to approximately coincide with each other. Further, a homogeneous magnetic field space 10 is designed on the basis of the center position.

However, it is actually hard to coincide the center of the bore and the center of the sample, in the light of a manufacturing precision of the probe and a sample tube inserting mechanism itself, and a manufacturing precision of the horizontal bore and the vertical bore. Further, since a coil end portion of the split magnet is located at a position close to the magnetic field center position, an irregular magnetic field caused by a tolerance at a time of manufacturing the coil or installing the coil is larger in comparison with the solenoid type magnet, and it is impossible to set the homogeneous magnetic field space larger in comparison with the sample measuring region. Accordingly, even if the center of the bore, the center of the probe coil and the center of the sample are designed in such a manner as to coincide with each other within the narrow homogeneous magnetic field space, there is a problem that it is very hard to achieve the designed structure.

BRIEF SUMMARY OF THE INVENTION

An object of the present invention is to provide an NMR apparatus provided with a split type magnet, which can solve the problem mentioned above and can easily measure an NMR signal with a high positional precision, and a positioning method of the same.

In order to achieve the object mentioned above, in accordance with the present invention, there is provided a positioning method of an NMR apparatus in which an NMR probe is inserted to one bore provided in a split type magnet, and a sample tube is inserted to the other bore, wherein a position of the NMR probe is determined on the basis of a sharpness of a frequency spectrum obtained from an NMR signal.

Further, in the method according to the invention, a position of a probe coil corresponding to a leading end of the NMR probe may be changed so as to determine a position of the NMR probe in such a manner that the sharpness of the frequency spectrum of the NMR signal received from the probe coil becomes high, and a magnetic field homogeneity coefficient of a position at which the probe coil is arranged becomes optimum.

In accordance with the present invention, there is provided an NMR apparatus comprising:
 a split type magnet;
 an NMR probe provided in one bore set in the magnet; and
 a sample tube provided in the other bore,
 wherein the NMR probe is set at a position determined in such a manner that a sharpness of a frequency spectrum of an NMR signal received from a probe coil corresponding to a leading end of the NMR probe becomes high, and a magnetic field homogeneity coefficient of a position at which the probe coil is arranged becomes optimum.

The sample tube may be previously located in the NMR probe.

Further, in order to adjust positions in a rotating direction and an axial direction of the NMR probe, the apparatus may be provided with a probe position adjusting mechanism structured such that two flanges are combined with a cryostat, an outer flange is attached in such a manner as to be movable in an axial direction, and an inner flange is fixed to the NMR probe, and is capable of being fixed at an optional angle without changing a relative position in the axial direction with the outer flange.

The coils wound around the split type magnet so as to face to each other may be constituted by a superconducting coil.

If the NMR signal measured in the space having an excellent magnetic field homogeneity coefficient is converted into a frequency spectrum, a peak portion thereof becomes very sharp. Thus, according to the present invention in which the position of the NMR probe is determined on the basis of the sharpness of the frequency spectrum, it is not necessary that the center of the bore and the center of the probe coil or the center of the sample coincide with each other, and it is possible to reduce a difficulty for positioning caused by a manufacturing precision.

Further, even if the homogeneous magnetic field space is formed in a very narrow complicated shape or is shifted from the originally designed position due to the manufacturing tolerance or the installation tolerance of the split type magnet, it is possible to securely locate the probe coil and the sample in the homogeneous magnetic field space so as to measure.

In accordance with the present invention, since the measuring position of the NMR apparatus is not fixed to the position of the physical center of the multi-axial bore, and can be set to the optimum position, it is possible to easily achieve the measurement within the necessary homogeneous magnetic field generating space.

Other objects, features and advantages of the invention will become apparent from the following description of the embodiments of the invention taken in conjunction with the accompanying drawings.

BRIEF DESCRIPTION OF THE SEVERAL VIEWS OF THE DRAWING

FIGS. 1A and 1B are schematic views showing an adjusting method of an NMR measuring apparatus in accordance with an embodiment of the present invention;

FIG. 5 is a schematic view showing a positioning of a room temperature shim coil;

FIG. 7 is a schematic view showing a position adjusting mechanism in accordance with the other embodiment of the present invention.

DETAILED DESCRIPTION OF THE INVENTION

A description will be in detail given below of a plurality of embodiments in accordance with the present invention with reference to the accompanying drawings.

Embodiment 1

Figure 2:
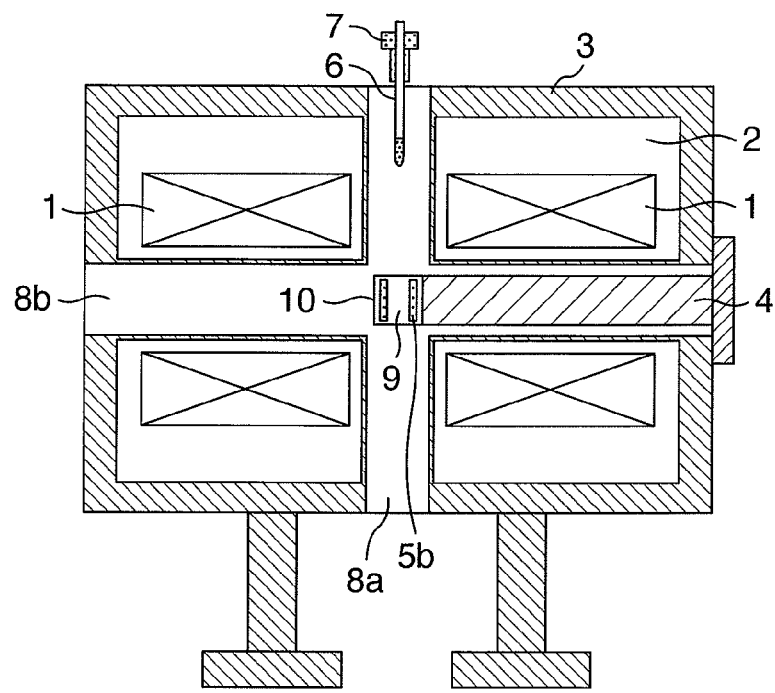
FIG. 2 is a cross sectional view of an NMR apparatus provided with a split magnet and a multi-axial bore.
Figure 3:
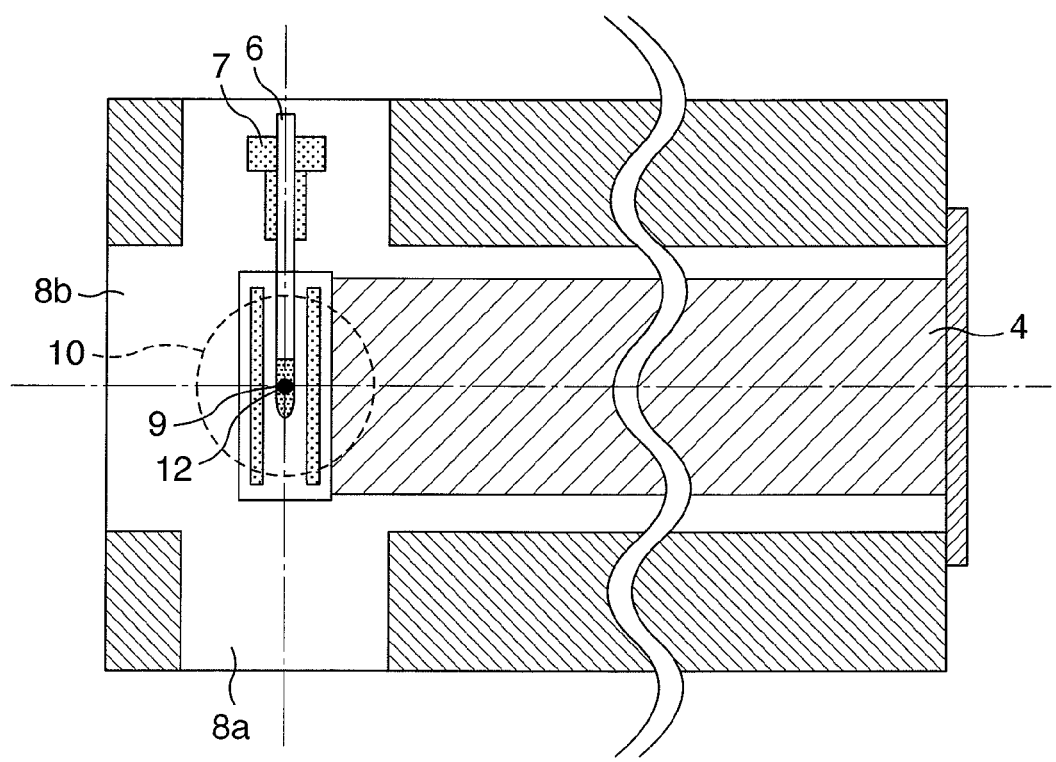
FIG. 3 is a conceptual view showing a general measuring position of the NMR apparatus provided with the split magnet.

FIG. 2 is a schematic view of a split type magnet of an NMR apparatus to which the present invention is applied, and a portion near the magnet. A split type magnet 1 is structured such that superconducting coils 1, 1 wound on a common center axis are arranged so as to face to each other, whereby a space (bore) to which a probe 4 or the like is inserted can be provided in a plurality of axial directions. A probe coil 5b is inserted from a horizontal bore 8b provided in a center axis of the split magnet 1, a sample tube 6 to which a spinner 7 is attached is inserted from a vertical bore 8a provided in a split gap portion in a vertical direction, and these elements are located in a homogeneous magnetic field space 10 around a bore center 9. Accordingly, the sample tube can be provided in the solenoid type coil, and it is possible to measure an NMR signal. In order to measure the NMR signal at a high sensitivity, it is important to set the probe coil 5 and the sample tube 6 within the homogeneous magnetic field space.

FIGS. 1A and 1B are schematic views showing a positioning method of the probe coil in accordance with an embodiment of the present invention. They show a portion around a bore center 10 of the NMR apparatus provided with the split magnet 1 and a cross bore constituted by a horizontal bore 8b provided in a horizontal center axis of the split magnet 1 and a vertical bore 8a provided in a split gap portion between the split magnets 1, 1 in a vertical direction. The NMR probe 4 is structured such that an inserting position of the coil can be adjusted with respect to the horizontal bore 8b, and an inserting position of the sample tube 6 can be adjusted with respect to the vertical bore 8a, respectively.

A positioning of a center of the probe coil 5 is first located at a suitable position by inserting the NMR probe 4 from the horizontal bore 8b, as shown in FIG. 1A. The sample tube 6 is inserted from the vertical bore 8a in such a manner that the NMR signal can be measured at this probe position, and the probe coil 5 measures the NMR signal. An NMR signal measuring apparatus 16 amplifies the NMR signal from the probe coil 5 and executes it an A/D conversion so as to determine an NMR spectrum signal, and thus, passes it to an NMR signal analyzing apparatus 17. The NMR signal analyzing apparatus 17 provided with a personal computer and a display apparatus compares the NMR spectrum signals, and searches a center position of the probe coil having the largest 1 of the spectrum. As shown in FIG. 1B, a position of the NMR probe 4 is moved, and the sample tube 6 is located at the position of the NMR probe 4 so as to measure the NMR signal. The NMR spectrum signals in the respective probe positions are compared by repeating the operations mentioned above, and the probe is set at a position where the sharpness is the largest, that is, the magnetic field homogeneity coefficient is high.

The more excellent the magnetic field homogeneity coefficient in the sample measuring region is, the higher sensitivity the NMR signal can be measured. Accordingly, it is possible to make a space position in which the magnetic field homogeneity coefficient at each of the probe positions, that is, the magnetic field homogeneity coefficient necessary for measuring is satisfied clear, by comparing the result of measurement (the NMR spectrum signal) at each of the probe positions. Accordingly, it is possible to achieve the NMR apparatus having the high sensitivity, by arranging the center position of the NMR probe coil 5 at a position having the highest magnetic field homogeneity coefficient.

As a specific method of comparing the NMR spectrum signal, in the NMR spectrum measured from the sample set in the space having an excellent magnetic field homogeneity coefficient, a peak becomes sharp as shown in FIG. 1A. On the other hand, in the NMR spectrum measured from the sample set in the space having an inferior magnetic field homogeneity coefficient, a peak becomes low and a slope becomes gradual, as shown in FIG. 1B.

In the present embodiment, the NMR signal analyzing apparatus 17 takes a mapping of a frequency spectrum by the same sample, within the space capable of measuring the NMR signal in which the horizontal bore and the vertical bore intersect. Further, it compares a value indicating a wire width such as a peak height, a half band width, a one-tenths width or the like. As a result, it is possible to measure the NMR signal having the high sensitivity by arranging the NMR probe at a position where the peak height becomes maximum, or the value indicating the spectrum wire width becomes minimum.

In this case, in the measurement in which the high sensitivity is not always necessary, it is not necessary to set the NMR probe at a position where an NMR spectrum shape is most excellent. It is preferable to arrange at a position where the peak height is about 90% or more of the maximum value, or where the spectrum wire width is within about twice the minimum value, within a region where a certain degree of magnetic field homogeneity coefficient can be expected.

Further, in the case of designing the NMR apparatus, the center of the homogeneous magnetic field space, the center of the probe coil and the center of the sample are defined in such a manner as to come to approximately the same position, and the design is executed on the basis of the center position. The center position is set to the bore center 10 in most cases, in the light of an easiness for manufacturing the probe and sample tube arranging mechanism. Accordingly, the split magnet 1 is designed in such a manner that the homogeneous magnetic field is generated around the bore center 10.

Figure 4A:
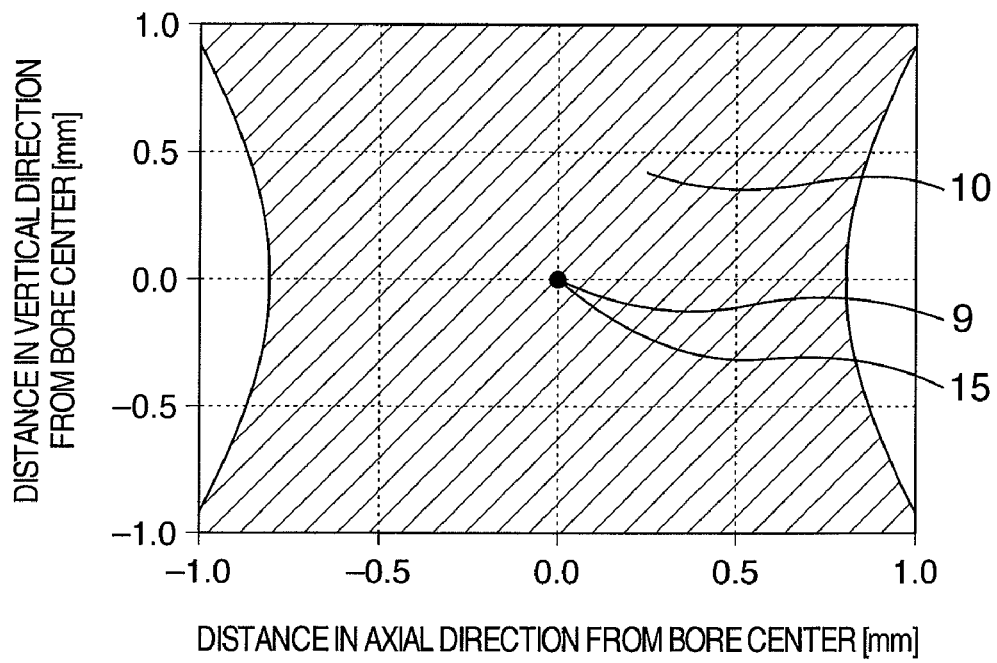
FIGS. 4A and 4B are characteristic views showing a magnetic field homogeneity coefficient of the split magnet.
Figure 4B:
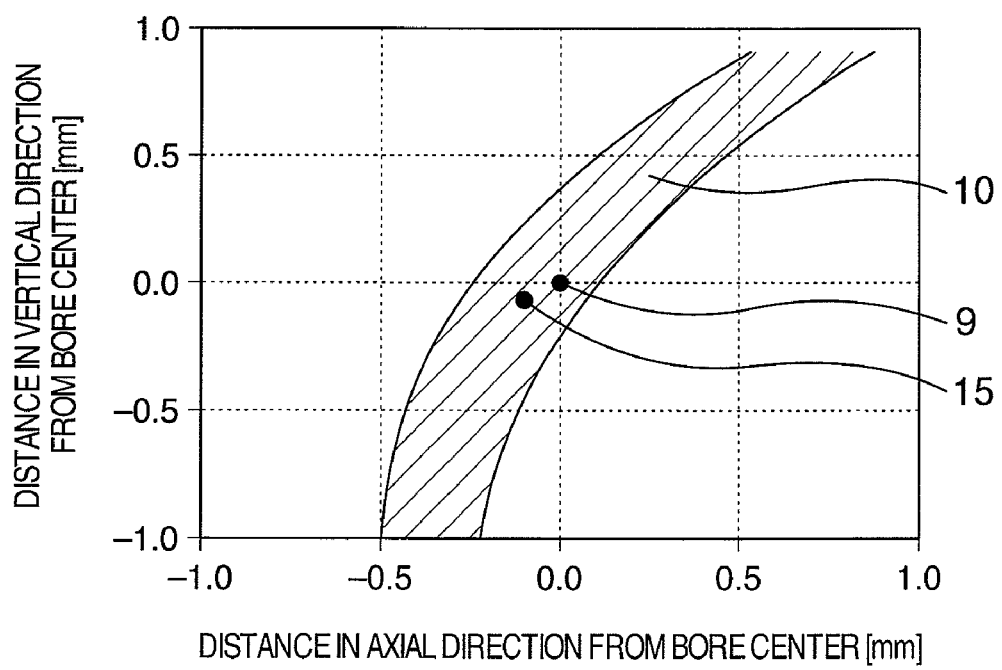

FIGS. 4A and 4B show an example of the homogeneous magnetic field space by the split magnet. FIG. 4A shows an ideal magnetic field space with no displacement which is designed such that the center 15 of the homogeneous magnetic field space comes to the bore center 9, in the split magnet 1 in which the coil groups having about 0.2 m in both of radius and height face to each other. FIG. 4B shows a homogeneous magnetic field space in the case that only one side coil group is shifted entirely at about 0.2 mm in a diametrical direction and at about 0.2 mm in an axial direction at a time of manufacturing. The homogeneous magnetic field spaces in FIGS. 4A and 4B show the spaces having the same magnetic field homogeneity coefficient. However, in FIG. 4B, the homogeneous magnetic field space is greatly deformed in the periphery of the bore center, by a slight 0.2 mm displacement, and a great displacement is generated with respect to the design value.

However, in accordance with the present embodiment, it is not necessary that the homogeneous magnetic field space 10 is set in the periphery of the bore center 9. It is preferable to locate the NMR probe 4 and the sample tube 6 within the actually generated homogeneous magnetic field space 10, and to set the position where the NMR signal becomes proper as the probe center position. Accordingly, it is possible to avoid the problem caused by the displacement between the design value and the actually mounted position.

There is a case that the NMR signal can not be measured in the structure in FIGS. 1A and 1B. In such a case, if the actually measured sample is used, it is impossible to discriminate whether or not the cause of the incapable measurement exists in the magnetic field homogeneity coefficient or in the small NMR signal obtained from the sample. Accordingly, it is preferable to position the probe by using a simulated sample in which the NMR spectrum shape is previously known in place of the sample. Therefore, it is found that the cause of the incapable measurement of the NMR signal in the positioning exists in the position where the magnetic field homogeneity coefficient is inferior, and a position having a better magnetic field homogeneity coefficient is searched.

Embodiment 2

FIG. 5 is a schematic view of a structure in which a shim coil is arranged in the horizontal bore space. A room temperature shim coil 11 is inserted to the horizontal bore 8b from an opposite direction to a direction of inserting the NMR probe 4. It is desirable to locate the room temperature shim coil 11 within a space having an excellent homogeneous magnetic field generated from the split magnet 1, for effectively utilizing a magnetic field correcting capacity. In the present embodiment, the NMR probe 4 is fixed to the room temperature shim coil 11, and the sample tube 6 is inserted in this state. The position of the room temperature shim coil is determined on the basis of the information of the magnetic field homogeneity coefficient at that time. A specific adjusting method is executed in the same manner as the case of the probe coil.

In the present embodiment, the room temperature shim coil 11 is inserted from the opposite side to the NMR probe 4, however, the structure may be made such that it is inserted from the same direction. Further, in place of the structure in which the room temperature shim coil 11 and the NMR probe 4 are inserted as the independent elements, the structure may be made such that an element obtained by integrally forming the both is inserted.

Embodiment 3

Figure 6:
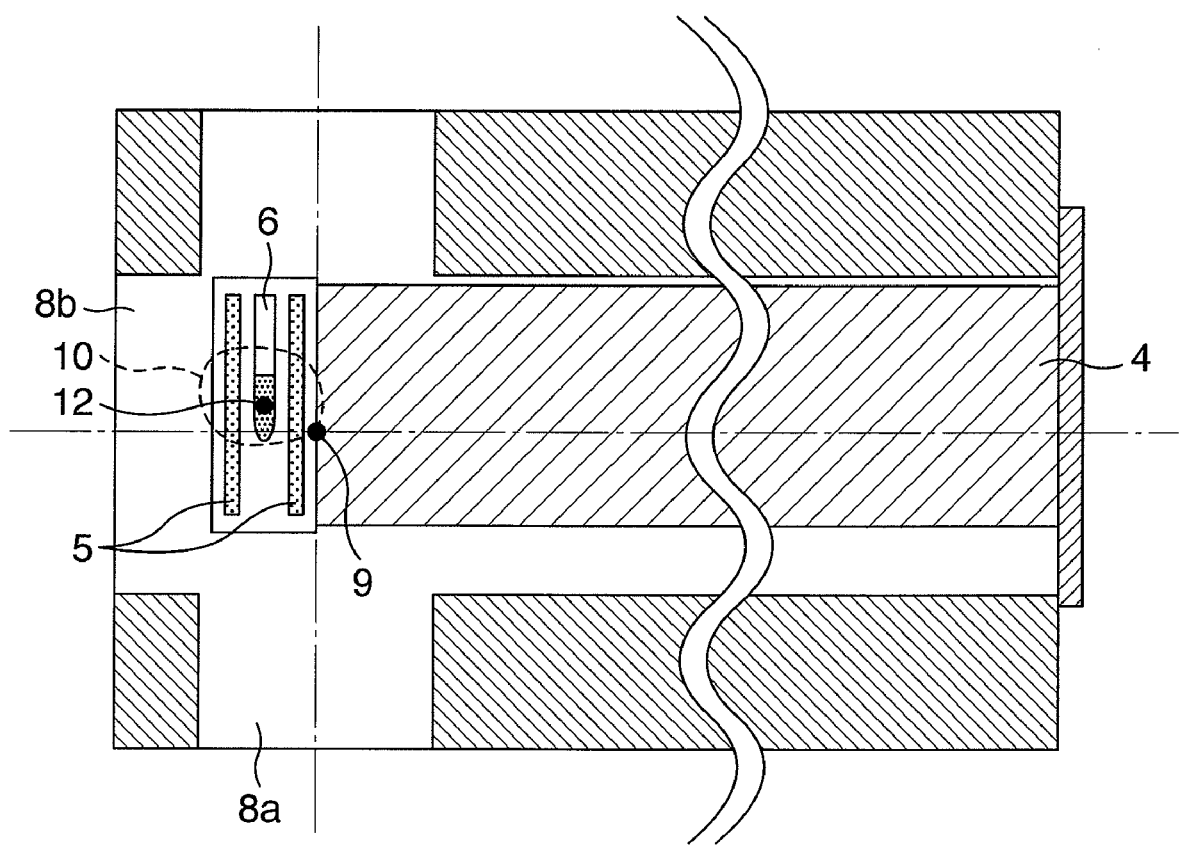
FIG. 6 is a cross sectional view of an NMR measuring apparatus in which a sample is attached to a probe coil.

FIG. 6 shows a structure in which the sample tube is previously attached to the NMR probe. In accordance with the present embodiment, in place of the structure in which the sample tube 6 is inserted as shown in FIGS. 1A and 1B, the sample tube 6 is previously attached to the NMR probe 4. Since it is possible to more precisely position the center of the probe coil and the center of the sample by previously attaching the sample tube 6 to the coil 5 of the NMR probe, it is possible to improve a measuring sensitivity of the NMR signal forming an information source of the magnetic field homogeneity coefficient.

Embodiment 4

In the embodiments mentioned above, the position adjustment of the NMR probe is independently executed. The position adjustment of the NMR probe may be executed by an absolutely independent mechanism from the NMR apparatus (the cryostat), however, may be executed at a connection position obtained by setting a connection between the cryostat and the NMR probe.

FIG. 7 is a schematic view of a structure in which the position adjusting mechanism of the probe is provided at the connection position to the cryostat. The mechanism of adjusting the position of the NMR probe 4 is provided in the flange portion 13 corresponding to the connection to the cryostat 3.

In order to adjust the position of the NMR probe 4 in the rotating direction and the axial direction, two flanges are combined in the cryostat, and an outer flange is attached in such a manner as to be movable in the axial direction. Further, an inner flange is fixed to the NMR probe 4, and is provided with a mechanism capable of fixing to the outer flange at an optional angle without changing the relative position in the axial direction.

In other words, the flange portion 13 is structured such as to combine two flanges 13a and 13b, and a cap nut 14 making it possible to move at about a few millimeters in an axial direction is attached to the outer flange 13a. The inner flange 13b is fixed to the NMR probe 4 main body, and can be fixed to the outer flange 13a at an optional angle without changing the relative position in the axial direction.

Further, the cap nut 14 is fixed to the cryostat 3. It is possible to adjust the position of the probe 4 in the axial direction and fix the probe 4 by adjusting the mounting position between the cap nut 14 and the outer flange 13a. It is possible to position the inner flange 13b in the rotating direction by adjusting the connection position of the outer flange 13a.

In the embodiment in FIG. 7, there is shown the mechanism of adjusting the position in the rotating direction and the axial direction, however, the positioning is not limited to them. It is possible to execute the position adjustment in the horizontal direction and the vertical direction with respect to the inserting direction of the NMR probe 4 by changing the direction of the adjusting threaded hole of the inner flange 13B.

The position adjustment can be structured by a mechanism of automatically adjusting the position by using a piezo element, a motor or the like. The structure can be made by a system of determining a position where the peak height becomes maximum or the spectrum wire width becomes minimum on the basis of the mapping result of the NMR spectrum, in accordance with the automatic position adjusting mechanism and a programming on the personal computer 17 shown in the embodiment 1, and executing an automatic adjustment of the NMR probe to the position.

As mentioned above, in accordance with the present invention, it is possible to achieve the NMR signal measurement within the magnetic field homogeneous space in the NMR apparatus provided with the split magnet and the multi-axial bore. In the same manner, the present invention can be also applied to an MRI apparatus measuring the NMR signal in the homogeneous magnetic field space generated by the magnet.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A positioning method of an NMR apparatus in which an NMR probe is inserted to one bore provided in a split type magnet, and a sample tube is inserted to the other bore, wherein a position of the NMR probe is determined on the basis of a sharpness of a frequency spectrum obtained from an NMR signal.

2. A positioning method of an NMR apparatus as claimed in claim 1, wherein the method changes a position of a probe coil corresponding to a leading end of the NMR probe, and determines a position of the NMR probe in such a manner that the sharpness of the frequency spectrum of the NMR signal received from the probe coil becomes high, and a magnetic field homogeneity coefficient of a position at which the probe coil is arranged becomes optimum.

3. A positioning method of an NMR apparatus as claimed in claim 1, wherein a sample loaded on the sample tube is constituted by a simulated sample in which an NMR spectrum shape is already known.

4. A positioning method of an NMR apparatus as claimed in claim 1, wherein a shim coil is arranged in a bore to which the NMR probe is inserted, and an adjustment of a magnetic field homogeneity coefficient is executed by the shim coil, at the determined position of the NMR probe.

5. An NMR apparatus comprising:
a split type magnet;
an NMR probe provided in one bore provided in the magnet; and
a sample tube provided in the other bore,
wherein the NMR probe is set at a position determined in such a manner that a sharpness of a frequency spectrum of an NMR signal received from a probe coil corresponding to a leading end of the NMR probe becomes high, and a magnetic field homogeneity coefficient of a position at which the probe coil is arranged becomes optimum.

6. An NMR apparatus as claimed in claim 5, wherein the sample tube is previously installed in the NMR probe.

7. An NMR apparatus as claimed in claim 5, wherein in order to adjust positions in a rotating direction and an axial direction of the NMR probe, the apparatus is provided with a probe position adjusting mechanism structured such that two flanges are combined with a cryostat, an outer flange is attached in such a manner as to be movable in an axial direction, and an inner flange is fixed to the NMR probe, and is capable of being fixed at an optional angle without changing a relative position in the axial direction with the outer flange.

8. An NMR apparatus as claimed in claim 5, wherein the coils wound around the split type magnet so as to face each other are constituted by a superconducting coil.

* * * * *